United States Patent [19]

Hiraki et al.

[11] Patent Number: 4,585,489
[45] Date of Patent: Apr. 29, 1986

[54] METHOD OF CONTROLLING LIFETIME OF MINORITY CARRIERS BY ELECTRON BEAM IRRADIATION THROUGH SEMI-INSULATING LAYER

[75] Inventors: Shun-ichi Hiraki, Hyogo; Kazuo Tsuru, Yokohama; Yoshikazu Usuki; Chigasaki, Chigasaki; Yutaka Koshino, Yokosuka, all of Japan

[73] Assignee: Kabushiki Kaisha Toshiba, Kawasaki, Japan

[21] Appl. No.: 648,138

[22] Filed: Sep. 7, 1984

[30] Foreign Application Priority Data

Sep. 26, 1983 [JP] Japan ................. 58-177381

[51] Int. Cl.$^4$ .................................. H01L 21/265
[52] U.S. Cl. .................... 148/1.5; 29/576 B; 29/576 T; 148/187; 148/DIG. 23; 148/DIG. 46; 357/38; 357/91
[58] Field of Search .............. 148/1.5, 187; 29/576 B, 29/576 T; 357/38, 91

[56] References Cited

U.S. PATENT DOCUMENTS

| | | | |
|---|---|---|---|
| 4,210,464 | 7/1980 | Tanaka et al. | 148/1.5 |
| 4,230,791 | 10/1980 | Chu et al. | 148/1.5 |
| 4,240,844 | 12/1980 | Felice | 148/1.5 |
| 4,318,750 | 3/1982 | Rai-Choudhury et al. | 148/1.5 |
| 4,328,610 | 5/1982 | Thompson et al. | 29/571 |
| 4,398,343 | 8/1983 | Yamazaki | 148/1.5 |
| 4,415,372 | 11/1983 | Koshino et al. | 29/576 B |
| 4,469,527 | 9/1984 | Sugano et al. | 148/1.5 |
| 4,479,829 | 10/1984 | Kniepkamp | 29/576 B |

FOREIGN PATENT DOCUMENTS

| | | |
|---|---|---|
| 2266301 | 3/1975 | France . |
| 2309036 | 4/1976 | France . |
| 0016537 | 5/1980 | Japan ................. 148/1.5 |
| 1496814 | 1/1978 | United Kingdom . |
| 1536719 | 12/1978 | United Kingdom . |
| 1566072 | 4/1980 | United Kingdom . |
| 2132817 | 12/1982 | United Kingdom . |

OTHER PUBLICATIONS

*IEEE Transactions on Electron Devices,* vol. ED-29, No. 5, May 1982, pp. 805-811, B. Jayant Baliga, "Electron Irradiation of Field-Controlled Thyristors".

*Primary Examiner*—Upendra Roy
*Attorney, Agent, or Firm*—Finnegan, Henderson, Farabow, Garrett & Dunner

[57] ABSTRACT

A semiconductor device and a method of manufacturing the same are disclosed wherein a semi-insulating film having a high trap density is formed on a semiconductor substrate so as to prevent charges from remaining in the semi-insulating film and to prevent a change in carrier density at the substrate surface upon irradiation thereof with radiation. The lifetime of minority carriers can be easily controlled without decreasing the junction breakdown voltages.

4 Claims, 13 Drawing Figures

CHANGE IN LIFETIME OF MINORITY CARRIERS IN THE DIRECTION OF SUBSTRATE THICKNESS UPON IRRADIATION WITH ELECTRON BEAM

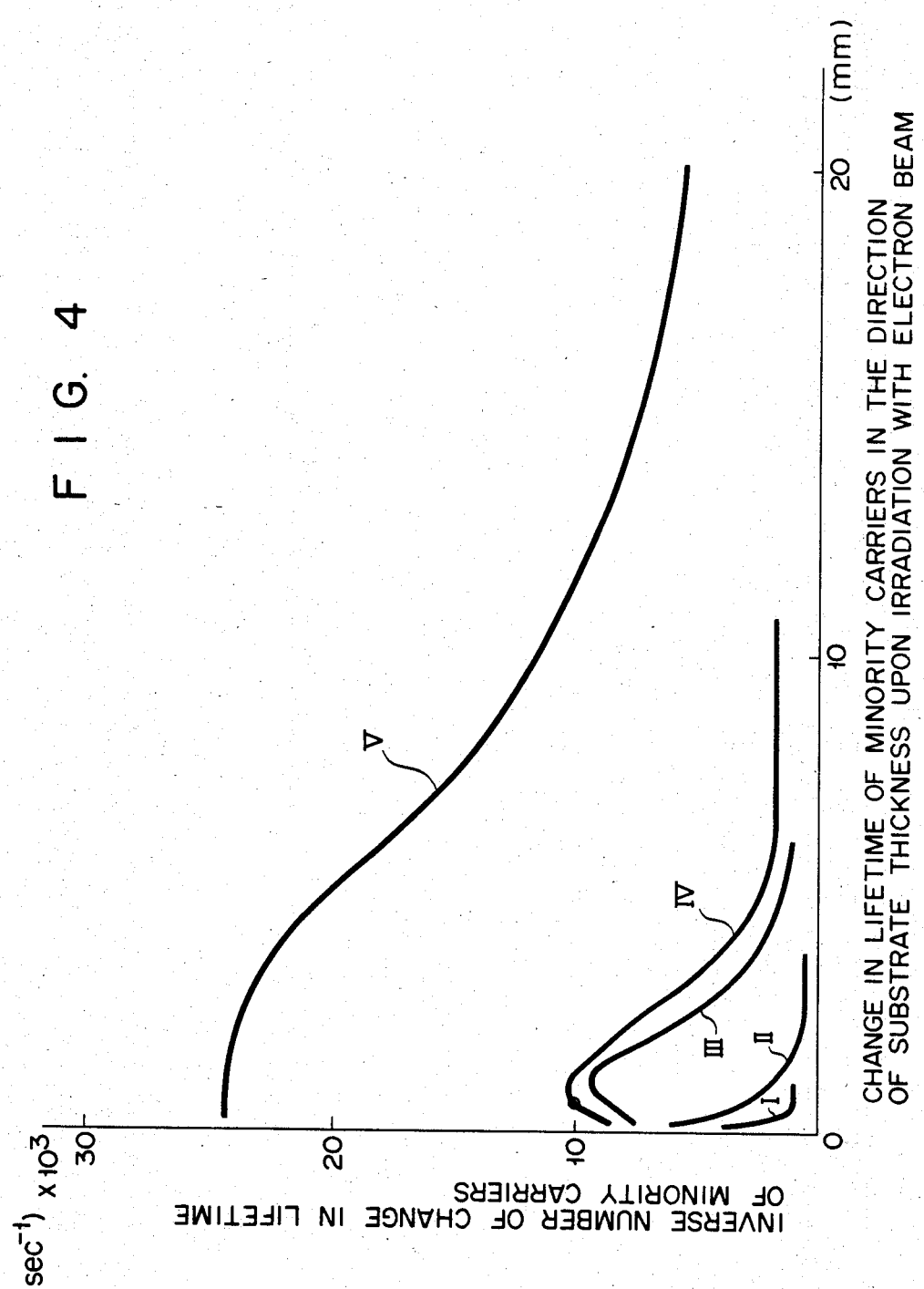

METHOD OF CONTROLLING LIFETIME OF MINORITY CARRIERS BY ELECTRON BEAM IRRADIATION THROUGH SEMI-INSULATING LAYER

BACKGROUND OF THE INVENTION

The present invention relates to a semiconductor device and a method of manufacturing a semiconductor device which can control the lifetime of minority carriers.

Conventional switching elements using silicon include transistors, silicon rectifying (SR) elements, silicon control rectifying (SCR) elements, and the like. An insulating film consisting of $SiO_2$, low-melting point glass or a resin is used as a protecting film for protecting a silicon substrate having such elements formed therein or a surface of a rectifying junction. Control of minority carriers in such elements is performed by diffusion of a heavy metal such as Au or Pt. According to this heavy metal diffusion method, as shown in FIG. 1A, an Au diffusion source film 4 is formed on a substrate wherein a $p^+$-type layer 3 is formed on an $n^+$-type layer 1 through an $n^-$-type layer 2. Annealing is performed to diffuse the heavy metal in the substrate, as shown in FIG. 1B. Thus, a deep level is formed in the semiconductor bandgap such that it serves as the recombination center for the minority carriers. Thus, the lifetime of the minority carriers is decreased to control the switching characteristics of the elements. However, with the heavy metal diffusion method, the thermal diffusion and hence the controllability depends upon the annealing temperature. Furthermore, this method has a low design allowance with respect to temperature and can therefore limit the yield of semiconductor devices.

A method for irradiating the $\gamma$-rays or with an electron beam controls the lifetime of minority carriers in the following manner. For example, as shown in FIG. 2A, an emitter region 8, a guard ring region 9, and a channel-cut region 10 are formed in a base region 7 and other surrounding portions of an $n^-$-type layer 6 on an $n^+$-type layer 5. A thermal oxide film 11, an Al electrode 12 connected to the emitter region 8, and a CVD (Chemical Vapor Deposition) PSG film 13 covering them are formed on the surface of the structure to provide a semiconductor substrate. Then, as shown in FIG. 2B, the semiconductor substrate is irradiated with a high-energy electron beam to intentionally form crystal defects which will serve as recombination centers for minority carriers. According to this method, the lifetime of the minority carriers can be controlled with high precision by intentionally introducing crystal defects. However, when such crystal defects are formed, defects are also formed in an insulating film and positive charges are generated in the insulating film. Generation of these positive charges results in a decrease in junction breakdown voltage. This phenomenon is particularly notable in the case of high breakdown-voltage elements. The degree of decrease in the junction breakdown voltage depends upon the dose of radiation. When the radiation dose increases, the decrease in the breakdown voltage also increases.

SUMMARY OF THE INVENTION

It is an object of the present invention to provide semiconductor device and a method of manufacturing the same wherein a semi-insulating film having a high trap density is formed in a semiconductor substrate so as to prevent charges from remaining in the semi-insulating film and to prevent an undesirable change in the carrier density in the substrate surface, thereby controlling the lifetime of the minority carriers without decreasing the junction breakdown voltage.

According to the present invention, a semi-insulating polycrystalline silicon film containing, for example, about 30 atomic % of oxygen is formed by CVD on a surface of a semiconductor substrate having one or more p-n junctions or Schottky junctions. An insulating film such as a silicon oxide film is formed thereover by conventional CVD. After forming an electrode wiring layer and a protective film, the resultant structure is irradiated with a predetermined dose of radiation having a high energy of 0.5 MeV or higher such as electron beams, $\gamma$-rays, X-rays, or neutron beams so as to obtain the desired switching characteristics. The positive charges generated in the semi-insulating film upon irradiation are trapped by the trap level in the film and flow therein as carriers. Therefore, since the positive charges do not remain in the film as fixed charges, they will not influence the carrier density in the substrate surface layer. Accordingly, the lifetime of minority carriers can be controlled without decreasing the junction breakdown voltage.

BRIEF DESCRIPTION OF THE DRAWINGS

FIG. 4 is a graph showing the inverse number of a change in the lifetime of minority carriers as a function of a change in the lifetime of minority carriers in the direction of thickness of the substrate upon irradiation thereof with an electron beam;

DETAILED DESCRIPTION OF THE PREFERRED EMBODIMENTS

The preferred embodiments of the present invention will now be described with reference to the accompanying drawings.

Figure 1A:
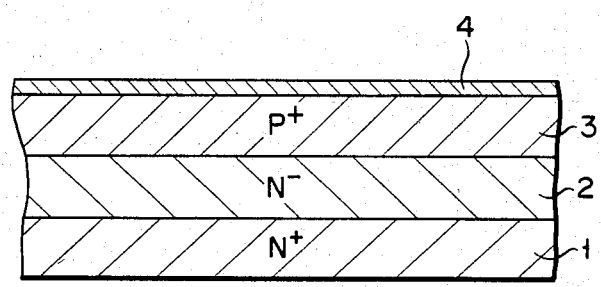
FIGS. 1A and 1B, and FIGS. 2A and 2B are sectional views sequentially showing conventional methods of manufacturing a semiconductor device.
Figure 1B:
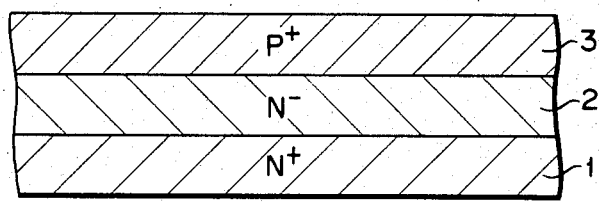
Figure 2A:
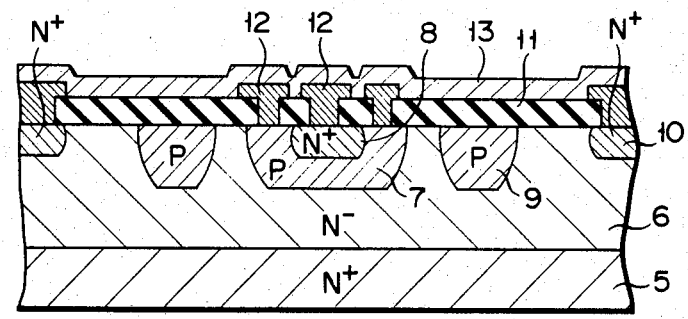
Figure 2B:
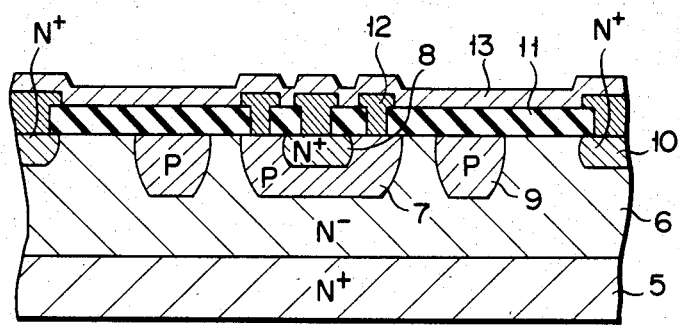
Figure 3A:
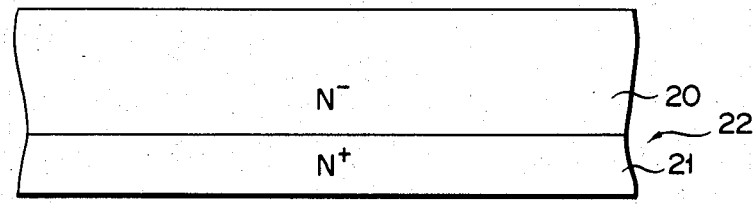
FIGS. 3A to 3F are sectional views sequentially showing a method of manufacturing a semiconductor device according to the present invention.

First, as shown in FIG. 3A, an $n^-$-type layer 20 having a specific resistivity of 40 $\Omega$.cm and a thickness of 80 $\mu$m and having a lapped surface is formed on an $n^+$-type layer 21 to provide a semiconductor substrate 22.

Figure 3B:
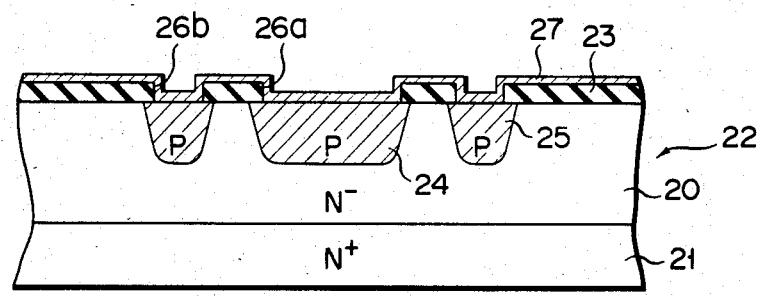
Figure 3C:
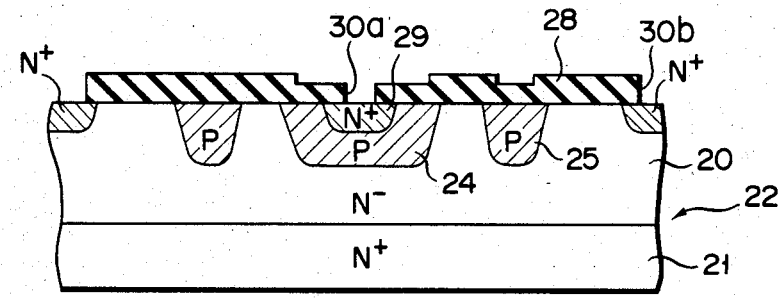

As shown in FIG. 3B, an oxide film 23 is formed on the surface of the $n^-$-type layer 20. Windows 26a and 26b for forming a base region 24 and a guard ring region 25 in a later step are formed at predetermined regions of the oxide film 23. A thermal diffusion source film 27 containing boron is formed on the oxide film 23 including portions of the surface of the $n^-$-type layer 20 which are exposed through the windows 26a and 26b. Thermal diffusion from the thermal diffusion source film 27 is performed at 1,000° C. for 30 minutes. After this heat-treatment, the thermal diffusion source film 27 is removed, and steam oxidation at 1,000° C. is performed to form an oxide film 28 of about 5,000 Å thickness on the exposed surface portions of the n⁻-type layer 20, as shown in FIG. 3C. Diffusion is performed again in an atmosphere containing nitrogen and oxygen at a temperature of 1,200° C. so as to form the base region 24 of about 20 μm deep. Upon this diffusion step, the guard ring region 25 of a predetermined junction depth is also formed.

Subsequently, as shown in FIG. 3C, a window 30a for forming an emitter region 29 in a later step is formed in that portion of the oxide film 28 covering the n⁻-type layer 20 which corresponds to the base region 24. At the same time, a window 30b for forming a channel-cut region 31 later is formed in a predetermined region of the oxide film 28. As in the case of the formation of the base region 24, a two-step diffusion method using a $P_2O_5$ film as a diffusion source film is performed to form the emitter region 29 in the base region 24 and the channel-cut region 31 in the n⁻-type layer 20.

Figure 3D:
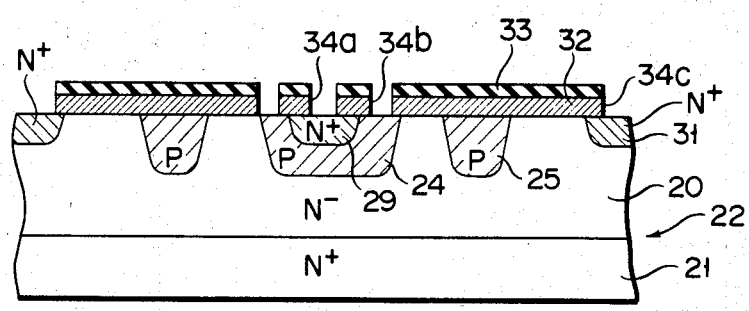

After the oxide film 28 is removed, as shown in FIG. 3D, a semi-insulating film 32 consisting of polycrystalline silicon containing 20 to 30 atomic % of oxygen and having a thickness of about 1 μm is formed on a major surface of the n⁻-type layer 20 by the reduced CVD method at a temperature of 700° C., using $SiH_4/N_2O$ gas, and at a vacuum pressure of about 1 Torr.

The semi-insulating film 32 must have a high trap density to trap positive charges generated therein so that fixed charges do not remain therein. Such a semi-insulating film 32 can consist of polycrystalline silicon containing one or both of oxygen and nitrogen, amorphous silicon containing one or both of oxygen and nitrogen, polycrystalline silicon carbide containing one or both of oxygen and nitrogen, or amorphous silicon carbide containing one or both of oxygen and nitrogen. The semi-insulating film 32 can also comprise an amorphous film. An $SiO_2$ film 33 is formed on the semi-insulating film 32 to a thickness of about 0.5 μm and is annealed in a nitrogen atmosphere at a temperature of 800° to 900° C. for about 30 minutes. Contact holes 34a, 34b and 34c reaching the emitter region 29, the base region 24, and the channel-cut region 31 are formed to extend through the $SiO_2$ film 33 and the semi-insulating film 32.

Figure 3E:
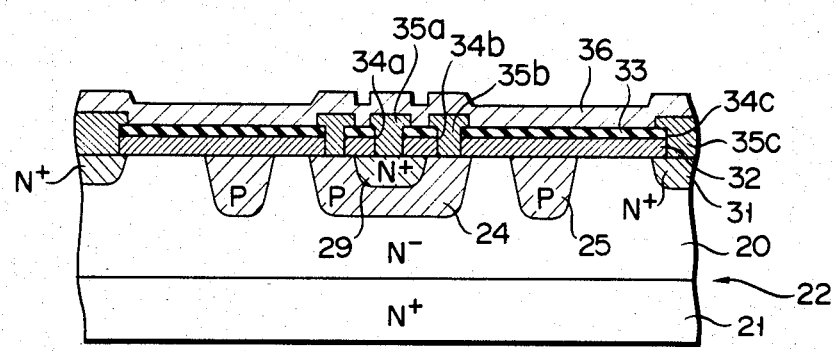

Then, as shown in FIG. 3E, electrodes 35a, 35b and 36c are formed to be connected to the emitter region 29, the base region 24, and the channel-cut region 31 through these contact holes 34a, 34b and 34c, respectively. Thereafter, an $Si_3N_4$ film as a passivation film 36 is formed to a thickness of about 1.5 μm by the plasma CVD method on the $SiO_2$ film 33 including the electrodes 35a, 35b and 35c. A rear surface electrode (not shown) consisting of a V/Ni/Au-type alloy is formed on the exposed rear surface of the n⁺-type layer 21.

Figure 3F:
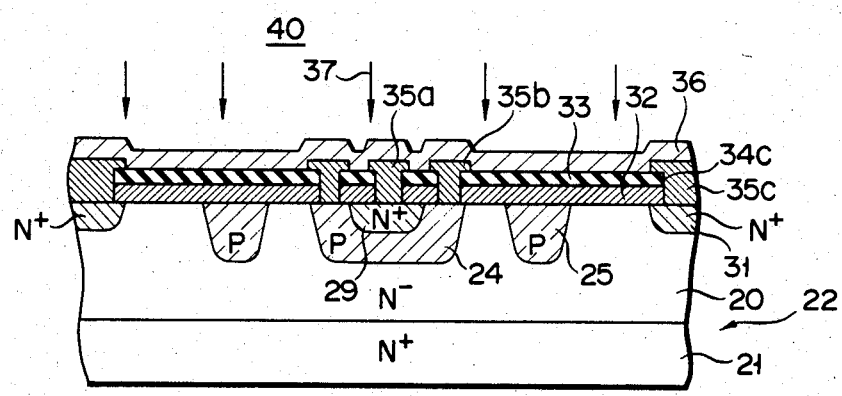

Finally, as shown in FIG. 3F, the side of the passivation film 36 of the structure is irradiated with electron beams 37 from an electron beam apparatus at an energy of 0.5 to 30 MeV and a dose of $1 \times 10$ to $1 \times 10^{15}$ cm⁻². Thus, the lifetime of the minority carriers inside the semiconductor substrate 23 is controlled to provide a semiconductor device 40 having predetermined switching characteristics (tstg.tf).

The means for controlling the lifetime of the minority carriers can be other types of radiation such as γ-rays, X-rays, or neutron beams in place of the electron beams. The energy of the radiation is preset to be 0.5 MeV or higher. If the radiation energy is less than 0.5 MeV, the lifetime of minority carriers cannot be controlled to a satisfactory degree.

FIG. 4 shows the inverse number of a change in lifetime of minority carriers as a function of the change in lifetime of minority carriers in the direction of thickness of the substrate upon irradiation thereof with electron beams. The results of curves I to V reveal that the lifetime of minority carriers can be easily controlled in accordance with radiation energy. Note that the curves I to V respectively correspond to the cases of radiation energies of 0.5 MeV, 1 MeV, 2.5 MeV, 3 MeV, and 10 MeV.

Figure 5:
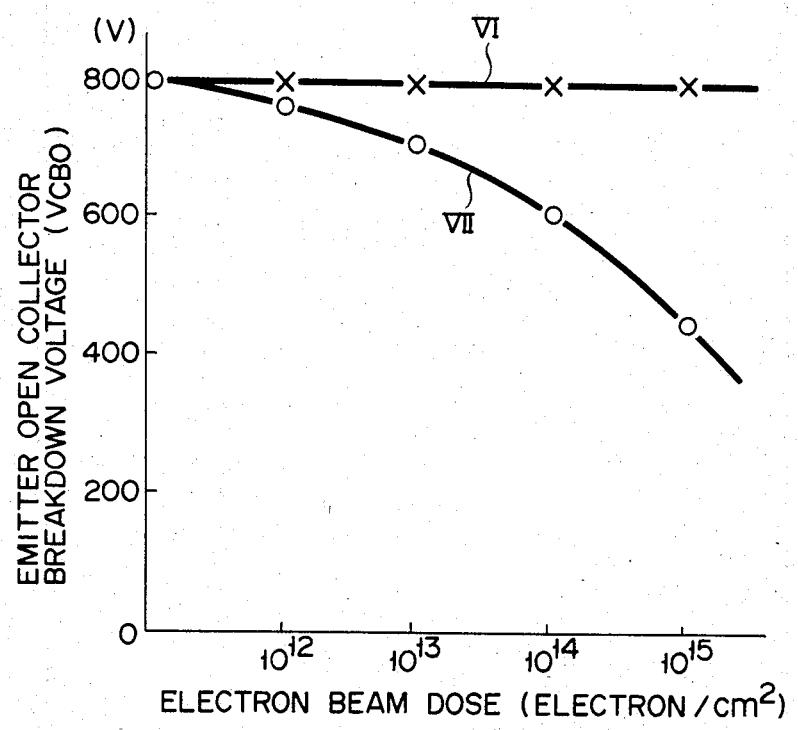
FIG. 5 is a graph showing the emitter open collector breakdown voltage as a function of electron beam dose.

Curve VI in FIG. 5 shows an emitter open collector breakdown voltage $V_{CBO}$ of the resultant semiconductor device 40 at specified electron beam doses. Note that the breakdown voltage $V_{CBO}$ does not decrease with an increase in electron beam dose in this case. However, curve VII which represents the case of a conventional semiconductor device not having the semi-insulating film 32 exhibits a decrease in the junction breakdown voltage. Such a decrease in the junction breakdown voltage in the conventional semiconductor device is surmised to have resulted from a reduction in the extension of the depletion layer at the junction surface between the substrate and the $SiO_2$ film caused by the positive charges due to trapped holes in the $SiO_2$ film on the substrate or in the interface between the substrate and the $SiO_2$ film, and from the electric field concentration at the junction surface. This phenomenon also occurs in the case wherein a low-melting point glass is used for the passivation film. In such a case, the degree of change in the charge density varies and a greater decrease in the breakdown voltage occurs than in the case wherein an $SiO_2$ film is formed on the substrate.

In contrast to this, in the semiconductor device 40 manufactured by the method of the present invention, irradiation with a high-energy beam is performed through the semi-insulating film 32 containing oxygen or nitrogen. Therefore, the trapped holes can flow through the semi-insulating film 32 as a leakage current component. As a result, the decrease in the junction breakdown voltage can be prevented, and the lifetime of the minority carriers can be easily controlled.

Figure 6:
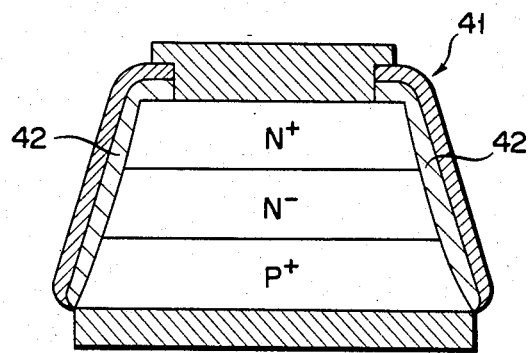
FIG. 6 is a sectional view showing another example of a semiconductor device according to a method of the present invention.

The present invention is similarly applicable to a semiconductor device 41 having a mesa structure by forming a semi-insulating film 42 on a bevel surface, as shown in FIG. 6.

In summary, according to a method of manufacturing a semiconductor device according to the present invention, a decrease in the junction breakdown voltage can be prevented, and the lifetime of minority carriers can be easily controlled.

What is claimed is:

1. A method of controlling the lifetime of minority carriers by electron beam irradiation through a semi-insulating layer, comprising the steps of:
    forming the semi-insulating layer on a semiconductor substrate having at least one rectifying junction; and
    irradiating the semiconductor substrate with an electron beam through the semi-insulating layer so as to control the lifetime of the minority carriers contained in the semiconductor substrate.

2. A method according to claim 1, wherein said semi-insulating film is directly formed on the rectifying junction which is exposed on a surface of said semiconductor substrate.

3. A method according to claim 1, wherein the electron beam is radiated at an energy of at least 0.5 MeV.

4. A method according to claim 1 or 2, wherein said semi-insulating film consists of one member selected from the group consisting of polycrystalline silicon containing at least one of oxygen and nitrogen, amorphous silicon containing at least one of oxygen and nitrogen, polycrystalline silicon carbide containing at least one of oxygen and nitrogen, and amorphous silicon carbide containing at least one of oxygen and nitrogen.

* * * * *